(12) United States Patent
Sakurai et al.

(10) Patent No.: US 6,514,657 B1
(45) Date of Patent: Feb. 4, 2003

(54) PHOTOSENSITIVE COMPOSITION FOR LITHOGRAPHIC PRINTING PLATE AND PHOTOSENSITIVE LITHOGRAPHIC PRINTING PLATE

(75) Inventors: Hideo Sakurai, Konosu (JP); Eiji Hayakawa, Utsunomiya (JP)

(73) Assignee: Kodak Polychrome Graphics, L.L.C., Norwalk, CT (US)

(*) Notice: Subject to any disclaimer, the term of this patent is extended or adjusted under 35 U.S.C. 154(b) by 14 days.

(21) Appl. No.: 09/906,968

(22) Filed: Jul. 17, 2001

(30) Foreign Application Priority Data

Jul. 19, 2000 (JP) .......................... 2000-219394

(51) Int. Cl.$^7$ .................. G03F 7/021; G03F 7/031; G03F 7/033
(52) U.S. Cl. .................. 430/157; 430/175; 430/176; 430/281.1; 430/288.1; 430/275.1; 430/278.1
(58) Field of Search ................ 430/157, 175, 430/176, 281.1, 288.1, 275.1, 278.1

(56) References Cited

U.S. PATENT DOCUMENTS

| | | |
|---|---|---|
| 2,367,661 A | 1/1945 | Agre |
| 2,448,828 A | 9/1948 | Renfrew |
| 2,722,512 A | 11/1955 | Crandall |
| 3,046,127 A | 7/1962 | Barney et al. |
| 3,549,367 A | 12/1970 | Chang et al. |
| 3,751,259 A | 8/1973 | Bauer et al. |
| 3,864,133 A | 2/1975 | Hisamatsu et al. |
| 3,870,524 A | 3/1975 | Watanabe et al. |
| 3,929,489 A | 12/1975 | Arcesi et al. |
| 4,038,257 A | 7/1977 | Suzuki et al. |
| 4,123,276 A | 10/1978 | Kita et al. |
| 4,212,970 A | 7/1980 | Iwasaki |
| 4,215,041 A | 7/1980 | Phlipot et al. |
| 4,239,850 A | 12/1980 | Kita et al. |
| 4,282,301 A | 8/1981 | Ohta |
| 4,284,705 A | 8/1981 | Phlipot et al. |
| 4,588,669 A | 5/1986 | Asano |
| 4,687,727 A | 8/1987 | Toyama et al. |
| 5,080,999 A | * 1/1992 | Imai et al. .................. 430/157 |

FOREIGN PATENT DOCUMENTS

| | | |
|---|---|---|
| EP | 0 239 082 | 9/1987 |
| GB | 1 256 859 | 12/1971 |
| JP | 48-54183 | 9/1973 |
| JP | 48-41708 | 12/1973 |
| JP | 49-43191 | 11/1974 |
| JP | 50-6034 | 3/1975 |
| JP | 51-37193 | 3/1976 |
| JP | 51-48516 | 12/1976 |
| JP | 52-30490 | 8/1977 |
| JP | 57-43890 | 9/1978 |
| JP | 54-30121 | 3/1979 |
| JP | 57-42858 | 9/1982 |
| JP | 57-51656 | 11/1982 |
| JP | 59-53836 | 3/1984 |
| JP | 59-208552 | 11/1984 |
| JP | 60-2945 | 1/1985 |
| JP | 60-165646 | 8/1985 |
| JP | 60-203630 | 10/1985 |
| JP | 61-273538 | 12/1986 |
| JP | 61-285449 | 12/1986 |
| JP | 62-36657 | 2/1987 |
| JP | 62-226143 | 10/1987 |
| JP | 10-282658 | 10/1998 |

* cited by examiner

*Primary Examiner*—John S. Chu
(74) *Attorney, Agent, or Firm*—Ohlandt, Greeley, Ruggiero & Perle, LLP

(57) ABSTRACT

The present invention provides a photosensitive lithographic printing plate with a long press life, high sensitivity, and excellent storage stability, and a photosensitive composition for a lithographic printing plate for producing such a photosensitive lithographic printing plate. The photosensitive composition for the lithographic printing plate includes (A) a binder resin, (B) a diazo resin, (C) a monomer or oligomer, a molecule of which has at least two polymerizable ethylenically unsaturated double bonds, (D) a photopolymerization initiator, (E) an o-tert-butylphenol derivative, and (F) a 2-mercaptoimidazole derivative such as 2-mercaptobenzimidazole.

24 Claims, No Drawings

PHOTOSENSITIVE COMPOSITION FOR LITHOGRAPHIC PRINTING PLATE AND PHOTOSENSITIVE LITHOGRAPHIC PRINTING PLATE

BACKGROUND OF THE INVENTION

1. Field of the Invention

The present invention relates to a photosensitive composition for a lithographic printing plate and to a photosensitive lithographic printing plate which utilizes the photosensitive composition. In particular, the present invention relates to a photosensitive lithographic printing plate with a long press life, high sensitivity, and excellent storage stability, and to a photosensitive composition for a lithographic printing plate for producing such a photosensitive lithographic printing plate.

2. Description of the Prior Art

Photosensitive lithographic printing plates are typically formed by providing a photosensitive layer including a photosensitive compound on the surface of a support such as aluminum, paper or plastic, which has undergone suitable surface treatment. Such photosensitive lithographic printing plates are manufactured by the application of a photosensitive composition, including a photosensitive compound which has been dissolved or dispersed in an organic solvent, to the surface of the support, followed by subsequent drying.

Photosensitive lithographic printing plates of this type, such as a photopolymerizable photosensitive lithographic printing plate in which a photosensitive composition including a binder resin, a monomer having ethylenically unsaturated double bonds, and a photopolymerization initiator is applied on a support having a hydrophilic surface, are generally used in the manner described below.

First, with a negative film or the like superimposed thereon, the photosensitive layer of a photopolymerizable photosensitive lithographic printing plate is exposed to light, and the exposed areas undergo polymerization and/or crosslinking and become insoluble in the developing solution. The photosensitive lithographic printing plate is then developed, and the unexposed areas are dissolved by the developing solution. Therefore, the area which is insoluble in the developing solution forms the "image area", which repels water and which is to retain oil-based ink, whereas the area dissolved by the developing solution forms the "non-image area", which is to retain water and which repels oil-based ink.

Since the photosensitive layer of such a photopolymerizable photosensitive lithographic printing plate is susceptible to inhibition of polymerization by oxygen, an overcoat layer including a polyvinyl alcohol or the like is provided on the photosensitive layer so that a practical press life and sensitivity can be maintained.

A photosensitive lithographic printing plate which does not require an overcoat layer is proposed in, for example, Japanese Unexamined Patent Application, First Publication No. Sho 59-53836, which is a photosensitive lithographic printing plate of a photopolymerizable composition/diazo resin hybrid system in which a photosensitive composition including a binder resin, a diazo resin, a monomer having ethylenically unsaturated double bonds, and a photopolymerization initiator is applied on a support.

Such a photosensitive lithographic printing plate of a photopolymerizable composition/diazo resin hybrid system can have practical levels of press life and sensitivity even without an overcoat layer due to the effect of the diazo resin reducing inhibited polymerization caused by oxygen.

However, the press life and the sensitivity of these photopolymerizable photosensitive lithographic printing plates and photosensitive lithographic printing plates of a photopolymerizable composition/diazo resin hybrid system are still insufficient to satisfy recent demands for extending press life and increasing sensitivity, and further improvements in the press life and the sensitivity have been sought after.

On the other hand, since a photopolymerizable photosensitive composition contains a monomer having ethylenically unsaturated double bonds, there is a problem in that the storage stability of the photosensitive composition and that of a photosensitive lithographic printing plate using the photosensitive composition are inferior.

A photopolymerizable photosensitive composition which has improved storage stability is proposed in Japanese Unexamined Patent Application, First Publication No. Sho 60-2945, which contains a stabilizer including an o-tert-butylphenol derivative and a heterocyclic thiol.

If the photopolymerizable photosensitive composition is used in a photosensitive layer of a photosensitive lithographic printing plate, the storage stability is improved. However, the press life and the storage stability are still insufficient in comparison with those of conventional diazo-type photosensitive lithographic printing plates, which do not have ethylenically unsaturated double bonds, and need to be further improved.

Accordingly, the object of the present invention is to provide a photosensitive lithographic printing plate with a long press life, high sensitivity, and excellent storage stability, and to provide a photosensitive composition for a lithographic printing plate for producing such a photosensitive lithographic printing plate.

The inventors have made diligent studies in order to achieve the above object, and as a result have completed the present invention based on the finding that the addition of a stabilizer including a combination of a specific phenol compound and a specific mercaptoimidazole compound to a photosensitive composition of a photopolymerizable composition/diazo resin hybrid system results in a photosensitive lithographic printing plate with a longer press life and higher sensitivity than those of a conventional photosensitive lithographic printing plate of a photopolymerizable composition/diazo resin hybrid system, and with a storage stability superior to that of a conventional photopolymerizable photosensitive lithographic printing plate in which a photosensitive composition is used which contains a stabilizer including an o-tert-butylphenol derivative and a heterocyclic thiol.

SUMMARY OF THE INVENTION

The present invention provides a photosensitive composition for a lithographic printing plate which includes:

a binder resin;

a diazo resin;

a monomer or oligomer compound having at least two polymerizable ethylenically unsaturated double bonds;

a photopolymerization initiator;

an o-tert-butylphenol derivative; and a 2-mercaptoimidazole derivative.

The present invention further provides a photosensitive lithographic printing plate which includes:

a support; and a photosensitive composition according to the present invention for a lithographic printing plate on the support.

As indicated by the comparative examples, printing plates that use the photosensitive composition according to the present invention exhibited superior press life, sensitivity and storage stability relative to those of the conventional photosensitive lithographic printing plates.

The present invention is described in detail in the following section.

DETAILED DESCRIPTION OF THE INVENTION

The photosensitive composition for a lithographic printing plate according to the present invention includes:

(A) a binder resin;

(B) a diazo resin;

(C) a monomer or oligomer, a molecule of which has at least two polymerizable ethylenically unsaturated double bonds;

(D) a photopolymerization initiator;

(E) an o-tert-butylphenol derivative; and (F) a 2-mercaptoimidazole derivative represented by the following general formula (I):

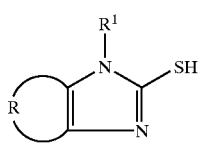

wherein R is a group which forms an aromatic ring fused to the imidazole ring and may be substituted with a halogen or an alkyl group; $R^1$ is H, Na, K, or —$CH_2$—$N(—R^2)_2$; and $R^2$ is a $C_1$ to $C_{10}$ alkyl group.

It is preferable that the binder resin (A) have ethylenically unsaturated bonds.

It is preferable that the binder resin (A) have an alkali-soluble group.

A binder resin which has been used in a conventional negative photosensitive lithographic printing plate can be used in the binder resin (A) of the present invention. Examples of such binder resins include (meth)acrylic acid/(meth)acrylic acid ester copolymers, copolymers including a hydroxyalkyl (meth)acrylate having an acid value of 10 to 100 and a (meth)acrylonitrile as disclosed in U.S. Pat. No. 4,123,276, copolymers including an aromatic hydroxyl group as disclosed in Japanese Examined Patent Application, Second Publication No. Sho 57-43890, and copolymers including a 2-hydroxy-3-phenoxypropyl (meth)acrylate unit as disclosed in Japanese Examined Patent Application, Second Publication No. Sho 57-51656; epoxy resins; polyamide resins; halogenated vinyl resins such as polyvinyl chloride and polyvinylidene chloride; polyvinyl acetate; polyesters; acetal resins such as formal resins and butyral resins; soluble polyurethane resins marketed by the American company Goodrich Ltd. under the brand name Estan; polystyrenes; styrene/maleic anhydride copolymers or half esters thereof; cellulose derivatives; shellac; rosin or modifications thereof; and copolymers with an unsaturated group in a side chain as disclosed in Japanese Unexamined Patent Application, First Publication No. Sho 61-285449 and Japanese Unexamined Patent Application, First Publication No. Hei 10-282658.

Otherwise, the binder resin may be a photocrosslinkable resin such as a copolymer having a cinnamic acid group and a carboxyl group as disclosed in Japanese Examined Patent Application, Second Publication No. Sho 54-15711; a polyester resin having a phenylenediacrylic acid residue group and a caroboxyl group as disclosed in Japanese Unexamined Patent Application, First Publication No. Sho 60-165646; a polyester resin with a phenylenediacrylic acid residue group and a phenolic hydroxyl group as disclosed in Japanese Unexamined Patent Application, First Publication No. Sho 60-203630; a polyester resin with a phenalenediacrylic acid residue group and a sodium iminodisulfonyl group as disclosed in Japanese Examined Patent Application, Second Publication No. Sho 57-42858; and a polymer with an azide group and a carboxyl group on a side chain as disclosed in Japanese Unexamined Patent Application, First Publication No. Sho 59-208552.

Among the above binder resins, a binder resin having ethylenically unsaturated bonds such as an acryloyl group, a methacryloyl group, and an allyl group is preferably used. Such a binder resin particularly improves the press life of the photosensitive lithographic printing plate to be obtained since the binder resin crosslinks with the monomer or oligomer (C), a molecule of which has at least two polymerizable ethylenically unsaturated double bonds, and increases the crosslink density.

When the photosensitive lithographic printing plate is developed using an aqueous alkali developing solution, a binder resin having an alkali-soluble group such as a carboxyl group, a phenolic hydroxyl group, and a sulfonamide group is preferably used among the above binder resins.

The amount of binder resin (A) used may preferably be within the range from 40 to 95% by weight, relative to the total weight of the composition solid material. Two or more binder resins may be used together, if necessary.

Examples of the diazo resin (B) include diazo resins represented by a salt of a condensation product of a diazo-diarylamine and an activated carbonyl compound. Among the diazo resins, one which is photosensitive, insoluble in water, and soluble in organic solvents is preferable.

Particularly suitable diazo resins include organic acid salts or inorganic acid salts of condensation products of at least one compound selected from 4-diazodiphenylamine, 4-diazo-3-methyldiphenylamine, 4-diazo-4'-methyldiphenylamine, 4-diazo-3'-methyldiphenylamine, 4-diazo-4'methoxydiphenylamine, 4-diazo-3-methyl-4'-ethoxydiphenylamine, and 4-diazo-3-methoxydiphenylamine, with at least one compound selected from as formaldehyde, para-formaldehyde, acetoaldehyde, benzaldehyde, and 4,4'-bis-methoxymethyidiphenyl ether.

Examples of diazo resin organic acids include methane sulfonic acid, benzene sulfonic acid, toluene sulfonic acid, xylene sulfonic acid, mesitylene sulfonic acid, dodecylbenzene sulfonic acid, naphthalene sulfonic acid, propylnaphthalene sulfonic acid, 1-naphthol-5-sulfonic acid, 2-nitrobenzene sulfonic acid, 3-chlorobenzene sulfonic acid, 2-hydroxy-4-methoxybenzophenone-5-sulfonic acid, 2,4-dihydroxybenzophenone, and benzenephosphine, whereas inorganic acids include hexafluoro phosphoric acid, tetrafluoro boric acid, and thiocyanic acid.

Other types of diazo resins which can be used include diazo resins disclosed in Japanese Unexamined Patent Application, First Publication No. Sho 54-30121 in which the principal chain is a polyester group; diazo resins produced by reacting polymers disclosed in Japanese Unexamined Patent Application, First Publication No. Sho 61-273538 which include carboxylic acid anhydride residues, with a diazo compound including a hydroxyl group; diazo resins produced by reacting a polyisocyanate compound with a diazo compound including a hydroxyl group; diazo resins having a carboxyl group; and diazo resins having a phenolic hydroxyl group.

The amount of diazo resin (B) used may preferably be within the range from 1 to 40% by weight, relative to the total weight of the composition solid material. Two or more diazo resins may be used together, if necessary.

The monomer or oligomer (C), a molecule of which has at least two polymerizable ethylenically unsaturated double bonds, (hereinafter referred to as "compound (C) having an ethylenically unsaturated group") according to the present invention is a monomer or oligomer which has a boiling point of 100° C. at the normal pressure, and has at least two addition-polymerizable ethylenically unsaturated groups within a molecule.

Examples of this type of monomer or oligomer include polyethylene glycol di(meth)acrylate (hereinafter methacrylate and acrylate are referred generally as "(meth)acrylate"), polypropylene glycol di(meth)acrylate, trimethylolpropane tri(meth)acrylate, neopentyl glycol di(meth)acrylate, pentaerythritol tri(meth)acrylate, pentaerythritol tetra(meth)acrylate, dipentaerythritol hexa(meth)acrylate, hexanediol di(meth)acrylate, tri(acryloyloxyethyl) isocyanurate, a (meth)acrylate of a polyvalent alcohol and alkylene oxide adduct, a (meth)acrylate of a polyvalent phenol and alkylene oxide adduct, urethane acrylates such as those disclosed in Japanese Examined Patent Application, Second Publication No. Sho 48-41708, Japanese Examined Patent Application, Second Publication No. Sho 50-6034, and Japanese Examined Patent Application, Second Publication No. Sho 51-37193, polyester acrylates such as those disclosed in Japanese Unexamined Patent Application, First Publication No. Sho 48-64183, Japanese Examined Patent Application, Second Publication No. Sho 49-43191, and Japanese Examined Patent Application, Second Publication No. Sho 52-30490, and epoxy acrylates formed by addition reactions between epoxy resins and (meth)acrylic acid.

The amount used of compound (C) having an ethylenically unsaturated group may preferably be within the range from 5 to 50% by weight, relative to the total weight of the composition solid material. Two or more compounds (C) having an ethylenically unsaturated group may be used together, if necessary.

Examples of the photopolymerization initiator (D) of the present invention include α-carbonyl compounds as disclosed in U.S. Pat. No. 2,367,661, acyloin ethers as disclosed in U.S. Pat. No. 2,448,828, α-hydrocarbon substituted aromatic acyloin compounds as disclosed in U.S. Pat. No. 2,722,512, polynuclear quinone compounds as disclosed in U.S. Pat. No. 3,046,127, combinations of a triaryl biimidazole and a p-aminophenyl ketone as disclosed in U.S. Pat. No. 3,549,367, trihalomethyl-s-triazine based compounds as disclosed in U.S. Pat. No. 4,239,850, oxadiazole compounds as disclosed in U.S. Pat. No. 4,212,970, acridine and phenazine compounds as disclosed in U.S. Pat. No. 3,751,259, and benzothiazole based compounds as disclosed in Japanese Examined Patent Application, Second Publication No. Sho 51-48516.

The amount of the photopolymerization initiator (D) used may preferably be within a range from 0.5 to 20% by weight, relative to the total weight of the composition solid material. Two or more photopolymerization initiators (D) may be used together, if necessary.

The o-tert-butylphenol derivative (E) of the present invention functions as an inhibitor to chain initiation. Examples of the o-tert-butylphenol derivative (E) include 2,6-di-tert-butylphenol, 2,6-di-tert-butyl-4-methylphenol, tetrakis (methylene-(3,5-di-tert-butyl-4-hydroxy-hydrocinnamate)) methane, ethylene glycol-bis(3,5-di-tert-butyl-4-hydroxy-hydrocinnamate), 4,4'-thiobis(2-tert-butyl-5-methylphenol), 2,2'-methylenebis(6-tert-butyl-4-methylphenol), 1,1,3-tris(5-tert-butyl-4-hydroxy-2-methylphenyl)butane, 2,4,6-tris(3,5-di-tert-butyl-4-hydroxybenzyl)mesitylene, 1,6-bis(3,5-di-tert-butyl-4-hydroxyphenylacetoxy)hexane, 6-(4-hydroxy-3,5-di-tert-butylanilino)-2,4-bis(n-octylthio)-1,3,5-triazine, n-octadecyl 3-(4'-hydroxy-3,5'-di-tert-butylphenyl) propionate, and diethyl 4-hydroxy-3,5-di-tert-butylbenzylphosphonate.

Among the above, 2,6-di-tert-butyl-4-methylphenol, 4,4'-thiobis(2-tert-butyl-5-methylphenol), and 2,2'-methylenebis(6-tert-butyl-4-methylphenol) are superior as stabilizers, and are preferably used. 2,2'-methylenebis(6-tert-butyl-4-methylphenol) is particularly preferably used. Two or more o-tert-butylphenol derivatives may be used together, if necessary.

The amount of this o-tert-butylphenol derivative (E) used may preferably be within a range from 0.1 to 5% by weight, relative to the total weight of the composition solid material. If the amount of the o-tert-butylphenol derivative (E) used is less than 0.1% by weight, sufficient effects thereof as a stabilizer do not emerge, whereas an amount exceeding 5% by weight would not result in better effects.

The 2-mercaptoimidazole derivative (F) of the present invention represented by the following general formula (I) (hereinafter referred to as "2-mercaptoimidazole derivative (F)") functions as an inhibitor to chain propagation.

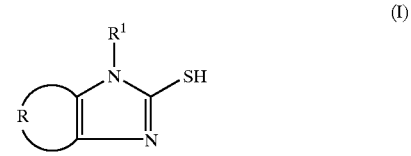

(I)

In this formula, R is a group which forms an aromatic ring fused to the imidazole ring and may be substituted with a halogen or an alkyl group; $R^1$ is H, Na, K, or —CH$_2$—N(—R$^2$)$_2$; and R is a $C_1$ to $C_{10}$ alkyl group.

Examples of the aromatic ring fused to the imidazole ring include a benzene ring and a naphthalene ring.

Examples of such 2-mercaptoimidazole derivatives (F) include 2-mercaptobenzimidazole and 2-mercapto-5-methylbenzimidazole, and among these, 2-mercaptobenzimidazole if preferably used since is has superior effects as a stabilizer. Two or more 2-mercaptoimidazole derivatives may be used together, if necessary.

The amount of this 2-mercaptoimidazole derivative (F) used may preferably be within a range from 0.1 to 3% by weight, relative to the total weight of the solid material of the photosensitive composition. If the amount of the 2-mercaptoimidazole derivative (F) used is less than 0.1% by weight, sufficient effects thereof as a stabilizer do not emerge, whereas an amount exceeding 3% by weight would not result in better effects.

Other known additives such as dyes, pigments, surfactants, plasticizers, and stabilizers can also be added to the photosensitive composition for a lithographic printing plate according to the present invention, if necessary.

Suitable dyes include basic oil soluble dyes such as crystal violet, malachite green, victoria blue, methylene blue, ethyl violet, and rhodamine B. Examples of commercially available products include "Victoria Pure Blue-BOH" (manufactured by Hodogaya Chemical Industries Ltd.) and "Oil Blue #603" (manufactured by Orient Chemical Industries Ltd.). Suitable pigments include phthalocyanine blue, phthalocyanine green, dioxazine violet, and quinacridone red.

Examples of surfactants are fluorosurfactants, such as those disclosed in Japanese Unexamined Patent Application, First Publication No. Sho 62-36657 and Japanese Unexamined Patent Application, First Publication No. Sho 62-226143, and the like.

Suitable plasticizers include diethylphthalate, dibutylphthalate, dioctylphthalate, tributyl phosphate, trioctyl phosphate, tricresyl phosphate, tri(2-chloroethyl) phosphate, and tributyl citrate.

In addition, examples of known stabilizers, which can be used together with the composition of the present invention, include phosphoric acid, phosphorous acid, oxalic acid, tartaric acid, malic acid, citric acid, dipicolinic acid, polyacrylic acid, benzenesulfonic acid, and toluenesulfonic acid.

The amount added of each of the above additives will vary depending on the purpose, although typically values within the range from 0 to 30% by weight, relative to the total weight of the photosensitive composition solid are preferable.

The above combination of the o-tert-butylphenol derivative (E) and the 2-mercaptoimidazole derivative (F) can greatly improve the storage stability of the photosensitive composition by inhibiting chain initiation and chain propagation caused by heat. Such a function can be remarkably exerted particularly when 2,2'-methylenebis(6-tert-butyl-4-methylphenol) and 2-mercaptobenzimidazole are combined.

Since a photosensitive composition of a photopolymerizable composition/diazo resin hybrid system, which includes a binder resin (A), a diazo resin (B), a compound (C) having ethylenically unsaturated double bonds, and a photopolymerization initiator (D), and a specific stabilizer, which includes an o-tert-butylphenol derivative (E), and a 2-mercaptoimidazole derivative (F), are combined in the photosensitive composition for a lithographic printing plate, synergistic effects of the combination are generated in that a photosensitive lithographic printing plate can be obtained with an improved press life and sensitivity in comparison with those of a conventional photosensitive lithographic printing plate of a photopolymerizable composition/diazo resin hybrid system, and with improved storage stability in comparison with that of a conventional photopolymerizable photosensitive lithographic printing plate in which a specific stabilizer is used.

The reason for the generation of such synergistic effects is considered to be as follows.

The 2-mercaptoimidazole derivative (F) also functions as a cosensitizer in the photosensitive composition, and therefore increases the crosslink density during photocuring. Accordingly, a photosensitive lithographic printing plate in which such a photosensitive composition is used is considered to possess improved sensitivity and press life.

In addition, in a photosensitive composition of a photopolymerizable composition/diazo resin hybrid system, a binder resin, a diazo resin, and a compound having ethylenically unsaturated double bonds are in general not compatible with each other. However, the combination of the diazo resin with the specific stabilizer including the o-tert-butylphenol derivative (E) and the 2-mercaptoimidazole derivative (F) generates the effect of improving the compatibility of the binder resin, the diazo resin, and the compound having ethylenically unsaturated double bonds. This improvement in the compatibility is assumed to allow effective exertion of the crosslinking functions of the diazo resin and the compound having ethylenically unsaturated double bonds, and to further enhance crosslinking during photocuring. In addition, in a similar manner, the improvement in the compatibility is assumed to allow effective exertion of the stabilizing effects of the above specific stabilizer, and to further improve the storage stability.

Photosensitive Lithographic Printing Plate

The photosensitive lithographic printing plate according to the present invention includes:

a metal support, and a photosensitive composition for a lithographic printing plate according to the present invention, which is provided on the metal support.

A photosensitive lithographic printing plate of the present invention is constructed basically of a support, and a photosensitive layer of an aforementioned photosensitive composition for a lithographic printing plate provided on top of the support.

Suitable examples of the support include metallic plates made of metals such as aluminum, zinc, copper, stainless steel, steel, or the like; plastic films such as polyethylene terephthalate, polycarbonate, polyvinyl acetal, or polyethylene; composite materials such as papers coated with a molten synthetic resin or coated with a synthetic resin solution, or plastic films with a metallic layer provided thereon by using techniques such as vacuum deposition or lamination; or other materials used as supports for printing plates.

Furthermore, in the case of supports using metallic surfaces, and particularly in the case of aluminum, it is preferable that the support has undergone some type of surface treatment such as a graining treatment, anodization treatment, or hydrophilic treatment.

A photosensitive lithographic printing plate of the present invention is manufactured by coating the surface of a support with a photosensitive composition for a lithographic printing plate which has been either dissolved or dispersed in an organic solvent, and then drying the photosensitive composition to form a photosensitive layer on top of the support.

Any conventional organic solvent can be used as the solvent for dissolving or dispersing the photosensitive composition. However, from the viewpoint of convenience during the drying process, solvents having a boiling point of between 40° C. and 200° C., preferably between 60° C. and 160° C. are usually selected.

Examples of suitable organic solvents include alcohols such as methyl alcohol, ethyl alcohol, n- or iso-propyl alcohol, n- or iso-butyl alcohol and diacetone alcohol; ketones such as acetone, methyl ethyl ketone, methyl propyl ketone, methyl butyl ketone, methyl amyl ketone, methyl hexyl ketone, diethyl ketone, diisobutyl ketone, cyclohexanone, methyl cyclohexanone, and acetyl acetone; hydrocarbons such as hexane, cyclohexane, heptane, octane, nonane, decane, benzene, toluene, xylene, and methoxybenzene; esters such as ethyl acetate, n- or iso-propyl acetate, n- or iso-butyl acetate, ethyl butyl acetate, and hexyl acetate; halides such as methylene dichloride, ethylene dichloride, and monochlorobenzene; ethers such as isopropyl ether, n-butyl ether, dioxane, dimethyl dioxane, and tetrahydrofuran; polyhydric alcohols and derivatives thereof such as ethylene glycol, methylcellosolve, methylcellosolve acetate, ethylcellosolve, diethylcellosolve, cellosolve acetate, butylcellosolve, butylcellosolve acetate, methoxymethoxyethanol, diethylene glycol monomethyl ether, diethylene glycol dimethyl ether, diethylene glycol methylethyl ether, diethylene glycol diethyl ether, propylene glycol, propylene glycol monomethyl ether, propylene glycol monomethyl ether acetate, propylene glycol monoethyl ether, propylene glycol monoethyl ether acetate, propylene glycol monobutyl ether, and 3-methyl-3-methoxybutanol; and special solvents such as dimethylsulfoxide, N,N-dimethylformamide, methyl lactate, and ethyl lactate. These solvents may be used singularly, or in mixtures of two or more solvents. The concentration of solid material within the photosensitive composition to be coated onto the support may typically be from 2 to 50% by weight.

Examples of suitable coating methods for applying the photosensitive composition include roll coating, dip coating, air knife coating, gravure coating, gravure offset coating, hopper coating, blade coating, wire doctor coating, and spray coating. The amount of photosensitive composition applied during the coating process may preferably be within a range from 10 ml/m$^2$ to 100 ml/m$^2$.

Drying of the photosensitive composition coated onto the support surface is usually carried out using heated air. The air temperature may preferably be heated to a temperature within a range from 30° C. to 200° C., preferably within a range from 40° C. to 140° C. The drying temperature is maintained at a constant level during the drying process. Alternatively, the drying temperature is gradually stepped up.

Furthermore, in some cases it may be beneficial to use a stream of air for moisture absorption. The heated air may preferably be blown over the coating at a rate of 0.1 m/s to 30 m/s, with values from 0.5 m/s to 20 m/s being particularly desirable.

The weight of the photosensitive composition coating following drying is typically within a range from approximately 0.5 to 5 g/m$^2$.

In a photosensitive lithographic printing plate formed in the manner described above, the photosensitive layer is exposed to light with a negative film or the like superimposed thereon, and once the exposed portions of the photosensitive layer are hardened and become insoluble, the plate is developed in a developing solution, which dissolves and removes the unexposed portions, producing a lithographic printing plate with a corresponding image formed on the support.

Suitable light sources used in the light exposure process include carbon arc lamps, mercury lamps, metal halide lamps, xenon lamps, chemical lamps, and lasers.

For the developing solution, a typical amine based alkali developing solution including an organic solvent, such as the developing solutions used in developing negative photosensitive lithographic printing plates, may be used. Furthermore, in those cases where the alkali soluble resin is used as a binder resin, an aqueous alkali developing solution which includes no substantial amounts of organic solvents may also be used.

If required, the developed lithographic printing plate may be subjected to water washing treatment and oil desensitization; oil desensitization without any water washing treatment; treatment with an acidic aqueous solution; or treatment with an acidic aqueous solution and oil desensitization.

EXAMPLES

As follows is a more detailed description of the present invention, based on a series of examples. The present invention however, is not limited in any way by these examples. In the examples the unit % refers to % by weight. Synthesis of Binder Resin (A)

A copolymer with a side chain unsaturated group was synthesized in accordance with the method disclosed in Example 1 in Japanese Unexamined Patent Application, First Publication No. Hei 10-282658.

18.75 g of N,N-dimethylacetamide was placed in a 200 ml four necked flask equipped with a nitrogen inlet tube, a thermometer, and a stirrer, and heated to 80° C. While blowing nitrogen gas into the flask, a monomer solution including 9.0 g of 2-hydroxyethylmethacrylate, 7.0 g of methylmethacrylate, 4.0 g of methacrylic acid, and 0.5 g of 2,2'-azobis(2,4-dimethylvaleronitrile) dissolved in 18.75 g of N,N-dimethylacetamide was dripped into the flask over a period of one hour. The temperature of the reaction solution was maintained at 80° C., and one hour after completion of the addition of the monomer solution, a further 0.25 g of 2,2'-azobis(2,4-dimethylvaleronitrile) was added and the mixture stirred for a further one hour. Following completion of the polymerization reaction, the introduction of nitrogen gas was stopped, and air was introduced instead. 0.2 g of hydroquinone monomethyl ether was added, and the temperature was cooled to 50° C. 10.7 g of methacryloyloxyethyl isocyanate was added at 50° C. 0.1 g of a reaction catalyst dibutyl tin dilaurate was added, and the reaction was then allowed to proceed for 3 hours. Following completion of the reaction, the temperature was cooled to room temperature and the reaction solution dripped into 2 liters of water to precipitate out the polymer. The polymer was filtered, washed and dried, and yielded 2.17 g of a copolymer with a side chain unsaturated group with a polystyrene conversion weight average molecular weight of 32,000.

Examples 1 to 3 and Comparative Examples 1 to 6

Using the copolymer with a side chain unsaturated group, a series of photosensitive composition coating liquids were prepared with the compositions shown in Table 1.

TABLE 1

| Photosensitive composition coating liquid (wt %) | Example | | | Comparative Example | | | | | |
|---|---|---|---|---|---|---|---|---|---|
| | 1 | 2 | 3 | 1 | 2 | 3 | 4 | 5 | 6 |
| Copolymer with side chain unsaturated group (Copolymer disclosed in Example 1 in JP-A-10-282558) | 6.8 | 6.8 | 6.8 | 6.8 | 6.8 | 6.8 | 6.8 | 7.6 | 7.3 |
| 4-Dodecylbenzenesulfonate salt of condensate of p-diazodiphenylamine and formaldehyde | 0.5 | 0.5 | 0.5 | 0.5 | 0.5 | 0.5 | 0.5 | — | — |
| Dipentaerythritol hexaacrylate | 2.0 | 2.0 | 2.0 | 2.0 | 2.0 | 2.0 | 2.0 | 2.0 | 2.0 |
| 2-(4-methoxynaphtyl)-4,6-bis(trichloromethyl)-s-triazine | 0.2 | 0.2 | 0.2 | 0.2 | 0.2 | 0.2 | 0.2 | 0.2 | 0.2 |
| Malic acid | 0.1 | 0.1 | 0.1 | 0.1 | 0.1 | 0.1 | 0.1 | 0.1 | 0.1 |
| "Victoria Pure Blue" BOH (manufactured by Hodogaya Chemical Industries Ltd.) | 0.1 | 0.1 | 0.1 | 0.1 | 0.1 | 0.1 | 0.1 | 0.1 | 0.1 |
| 2,6-Di-tert-butyl-4-methylphenol | 0.2 | — | — | 0.3 | — | — | — | — | — |
| 4,4'-Thiobis(2-tert-butyl-4-methylphenol) | — | 0.2 | — | — | 0.3 | — | — | — | — |
| 2,2'-Methylenebis(6-tert-butyl-4-methylphenol) | — | — | 0.2 | — | — | 0.3 | — | — | 0.2 |
| 2-Mercaptobenzimidazole | 0.1 | 0.1 | 0.1 | — | — | — | 0.3 | — | 0.1 |
| Methyl glycol | 90.0 | 90.0 | 90.0 | 90.0 | 90.0 | 90.0 | 90.0 | 90.0 | 90.0 |

An aluminum sheet of thickness 0.30 mm was degreased by washing with an aqueous solution of sodium hydroxide, and then subjected to electrolytic polishing treatment in 2% aqueous hydrochloric acid to yield a grained sheet with an average center-line roughness (Ra) of 0.6 μm. The grained sheet was subsequently anodized in 20% aqueous sulfuric acid at a current density of 2 A/dm² to form an oxide film of 2.7 g/m². This anodized sheet was then immersed in a 2.5% aqueous solution of sodium silicate at 70° C. for 30 seconds, and then washed with water and dried to yield an aluminum support.

Each of the photosensitive composition coating liquids described above was then applied to an aluminum support using a roll coater at low speed, and subsequently dried at 100° C. for 3 minutes, to yield a photosensitive lithographic printing plate. The dried weight of the coating was 2.0 g/m².

Number of Printable Sheets (Press Life)

A negative image film of solid printing and halftone dots, and a step wedge with a step difference of 0.15 were affixed to each of the thus-obtained photosensitive lithographic printing plates. Using a metal halide lamp with an output of 2 kW positioned 1 m from the photosensitive lithographic printing plate, the photosensitive lithographic printing plate was then exposed for an exposure period which produced an optical sensitivity at the third step. Subsequently, development of the exposed photosensitive lithographic printing plate was carried out for 20 seconds at 30° C. using an automatic developing apparatus PD-912 manufactured by Dainippon Screen Manufacturing Co., Ltd., and a negative plate developing solution ND-1 (developing solution:water= 1:3 by volume) manufactured by Kodak Polychrome Graphics Japan Ltd., and a gum NF-2 manufactured by Kodak Polychrome Graphics Japan Ltd. was then applied. The thus formed lithographic printing plate was then used for printing. The results are shown in Table 2.

Number of Solid Steps on Step Wedge (Sensitivity)

A step wedge with a step difference of 0.15 was affixed to each of the thus-obtained photosensitive lithographic printing plates. Using a metal halide lamp with an output of 2 kW positioned 1 m from the photosensitive lithographic printing plate, the photosensitive lithographic printing plate was then exposed to light with an energy of 100 mJ/cm². Subsequently, development of the exposed photosensitive lithographic printing plate was carried out for 20 seconds at 30° C. using an automatic developing apparatus PD-912 manufactured by Dainippon Screen Manufacturing Co., Ltd., and a negative plate developing solution ND-1 (developing solution: water=1:3 by volume) manufactured by Kodak Polychrome Graphics Japan Ltd., and the number of solid steps on the step wedge was read. The results are shown in Table 2.

Storage Stability 14 sample pieces were cut out from the photosensitive lithographic printing plate obtained, and the sample pieces were left in an atmosphere at a high temperature and a high humidity, i.e., at a temperature of 50° C. and a humidity of 75%. One of the sample pieces was taken out every half day, and development was carried out for 20 seconds at 30° C. using an automatic developing apparatus PD-912 manufactured by Dainippon Screen Manufacturing Co., Ltd., and a negative plate developing solution ND-1 (developing solution : water=1:3 by volume) manufactured by Kodak Polychrome Graphics Japan Ltd., to determine the number of days until background staining (residue which was left undeveloped) occurred. The larger the number of days, the better the storage stability is considered to be. The results are shown in Table 2.

TABLE 2

|  | Number of Printable Sheets (Press Life) | Number of Solid Steps on Step Wedge (Sensitivity) | Number of Days until Background Contamination[a] (Storage Stability) |
| --- | --- | --- | --- |
| Example 1 | 290,000 | 3.0 | 6 |
| Example 2 | 300,000 | 3.0 | 6 |
| Example 3 | 300,000 | 3.0 | 7 |
| Comparative Example 1 | 170,000 | 2.5 | 1 |
| Comparative Example 2 | 180,000 | 2.5 | 2 |
| Comparative Example 3 | 170,000 | 2.5 | 2 |
| Comparative Example 4 | 230,000 | 3.0 | 1 |
| Comparative Example 5 | 30,000 | 1.0 | 0.5 |
| Comparative Example 6 | 40,000 | 1.5 | 4 |

[a]Portion which was left undeveloped.

As is clear from the above results, the photosensitive lithographic printing plates (Examples 1 to 3), in which the photosensitive composition of a lithographic printing plate was that of the present invention, had a press life, sensitivity, and storage stability which were all superior to those of conventional photosensitive lithographic printing plates (Comparative Examples 1 to 6). As described above, the photosensitive composition for a lithographic printing plate according to the present invention includes:

(A) a binder resin;

(B) a diazo resin;

(C) a monomer or oligomer, a molecule of which has at least two polymerizable ethylenically unsaturated double bonds;

(D) a photopolymerization initiator;

(E) an o-tert-butylphenol derivative; and (F) a 2-mercaptoimidazole derivative represented by the above general formula (I), can produce a photosensitive lithographic printing plate with a long press life, high sensitivity, and excellent storage stability.

Moreover, when the binder resin (A) has ethylenically unsaturated bonds, the press life of the photosensitive lithographic printing plate obtained can be further improved.

In addition, when the binder resin (A) has an alkali-soluble group, the photosensitive lithographic printing plate obtained is developable with an aqueous alkali developing solution.

Furthermore, the photosensitive lithographic printing plate according to the present invention includes:

a metal support, and a photosensitive composition for a lithographic printing plate according to the present invention which is provided on the metal support, has a long press life, high sensitivity, and excellent storage stability.

The present invention has been described with particular reference to the preferred embodiments. It should be understood that variations and modifications thereof can be devised by those skilled in the art without departing from the spirit and scope of the present invention. Accordingly, the present invention embraces all such alternatives, modifications and variations that fall within the scope of the appended claims.

What is claimed is:

1. A photosensitive composition for a lithographic printing plate, comprising:

(A) a binder resin;

(B) a diazo resin;

(C) a monomer or oligomer compound having at least two polymerizable ethylenically unsaturated double bonds;

(D) a photopolymerization initiator;

(E) an o-tert-butylphenol derivative; and (F) a 2-mercaptoimidazole derivative.

2. A photosensitive composition for a lithographic printing plate according to claim 1, wherein said binder resin has ethylenically unsaturated groups or alkali-soluble groups.

3. A photosensitive composition for a lithographic printing plate according to claim 2, wherein said binder resin has ethylenically unsaturated groups.

4. A photosensitive composition for a lithographic printing plate according to claim 2, wherein said binder resin has alkali-soluble groups.

5. A photosensitive composition for a lithographic printing plate according to claim 4, wherein said binder resin further comprises a binder resin having ethylenically unsaturated groups.

6. A photosensitive composition for a lithographic printing plate according to claim 1, wherein said binder resin is selected from the group consisting of: (meth)acrylic acid/ (meth)acrylic acid ester copolymer, hydroxyalkyl (meth) acrylate copolymer, 2-hydroxy-3-phenoxypropyl (meth) acrylate copolymer, epoxy resin, polyamide resin, halogenated vinyl resin, polyvinyl acetate, polyester, acetal resin, formal resin, butyral resin, soluble polyurethane resin, polystyrene, styrene/maleic anhydride copolymer, half esters of styrene/maleic anhydride copolymer, cellulose derivatives, shellac, rosin and modified rosin.

7. A photosensitive composition for a lithographic printing plate according to claim 1, wherein said diazo resin is a salt of a condensation product of a diazodiarylamine and an activated carbonyl or 4,4'-bis-methoxymethyl diphenylether compound.

8. A photosensitive composition for a lithographic printing plate according to claim 7, wherein said diazo resin is a salts of the condensation product of at least one compound selected from the group consisting of: 4-diazodiphenylamine, 4-diazo-3-methyldiphenylamine, 4-diazo-4'-methyldiphenylamine, 4-diazo-3'-methyldiphenylamine, 4-diazo-4'methoxydiphenylamine, 4-diazo-3-methyl-4'-ethoxydiphenylamine and 4-diazo-3-methoxydiphenylamine, with at least one compound selected from the group consisting of: formaldehyde, paraformaldehyde, acetaldehyde, benzaldehyde and 4,4'-bis-methoxymethyldiphenyl ether.

9. A photosensitive composition for a lithographic printing plate according to claim 1, wherein said monomer or oligomer compound having at least two polymerizable ethylenically unsaturated double bonds is selected from the group consisting of: polyethylene glycol di(meth)acrylate, polypropylene glycol di(meth)acrylate, trimethylolpropane tri(meth)acrylate, neopentyl glycol di(meth)acrylate, pentaerythritol tri(meth)acrylate, pentaerythritol tetra(meth) acrylate, dipentaerythritol hexa(meth)acrylate, hexanediol di(meth)acrylate, tri(acryloyloxyethyl) isocyanurate, a (meth)acrylate of a polyvalent alcohol and alkylene oxide adduct, a (meth)acrylate of a polyvalent phenol and alkylene oxide adduct, urethane acrylate, polyester acrylate and epoxy acrylate.

10. A photosensitive composition for a lithographic printing plate according to claim 1, wherein said photopolymerization initiator is selected from the group consisting of: α-carbonyl compounds, acyloin ethers, α-hydrocarbon substituted aromatic acyloin compounds, polynuclear quinone compounds, combinations of a triaryl biimidazole and a p-aminophenyl, trihalomethyl-s-triazine based compounds, oxadiazole compounds, acridine compounds, phenazine compounds and benzothiazole based compounds.

11. A photosensitive composition for a lithographic printing plate according to claim 1, wherein said o-tert-butylphenol derivative is selected from the group consisting of: 2,6-di-tert-butylphenol, 2,6-di-tert-butyl-4-methylphenol, tetrakis(methylene-(3,5-di-tert-butyl-4-hydroxy-hydrocinnamate))methane, ethylene glycol-bis(3, 5-di-tert-butyl-4-hydroxy-hydrocinnamate), 4,4'-thiobis(2-tert-butyl-5-methylphenol), 2,2'-methylenebis(6-tert-butyl-4-methylphenol), 1,1,3-tris(5-tert-butyl-4-hydroxy-2-methylphenyl)butane, 2,4,6-tris(3,5-di-tert-butyl-4-hydroxybenzyl)mesitylene, 1,6-bis(3,5-di-tert-butyl-4-hydroxyphenylacetoxy)hexane, 6-(4-hydroxy-3,5-di-tert-butylanilino)-2,4-bis(n-octylthio)-1,3,5-triazine, n-octadecyl 3-(4'-hydroxy-3,5'-di-tert-butylphenyl) propionate and diethyl 4-hydroxy-3,5-di-tert-butylbenzylphosphonate.

12. A photosensitive composition for a lithographic printing plate according to claim 1, wherein said 2-mercaptoimidazole derivative is represented by the formula (I):

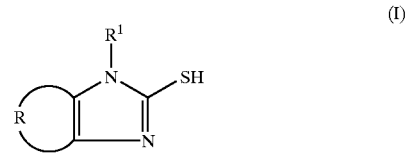

wherein R is a group which forms an aromatic ring fused to the imidazole ring; $R^1$ is selected from the group consisting of: H, Na, K and —CH$_2$—N(—R$^2$)$_2$ wherein each $R^2$ is independently a $C_1$ to $C_{10}$ alkyl group.

13. A photosensitive composition for a lithographic printing plate according to claim 11, wherein said aromatic ring is substituted with a group selected from the group consisting of: halogen, alkyl and a combination thereof.

14. A photosensitive lithographic printing plate comprising:

a support; and a photosensitive composition for a lithographic printing plate on said support, said photosensitive composition comprising:

(A) a binder resin;

(B) a diazo resin;

(C) a monomer or oligomer compound having at least two polymerizable ethylenically unsaturated double bonds;

(D) a photopolymerization initiator;

(E) an o-tert-butylphenol derivative; and (F) a 2-mercaptoimidazole derivative.

15. A photosensitive lithographic printing plate according to claim 14, wherein said support is selected from the group consisting of: metal, paper and plastic.

16. A photosensitive lithographic printing plate according to claim 15, wherein said support is a metal selected from the group consisting of: aluminum, zinc, copper, stainless steel and steel.

17. A photosensitive composition for a lithographic printing plate, the composition comprising:

(A) a binder resin;

(B) a diazo resin;

(C) a monomer or oligomer, a molecule of which has at least two polymerizable ethylenically unsaturated double bonds;
(D) a photopolymerization initiator;
(E) an o-tert-butylphenol derivative; and
(F) a 2-mercaptoimidazole derivative represented by the following general formula (I):

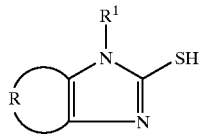

(I)

wherein R is a group which forms an aromatic ring fused to the imidazole ring and may be substituted with a halogen or an alkyl group; $R^1$ is H, Na, K, or —$CH_2$—N(—$R^2$)$_2$; and $R^2$ is a $C_1$ to $C_{10}$ alkyl group.

18. A photosensitive composition for a lithographic printing plate according to claim 17, wherein the binder resin (A) has ethylenically unsaturated bonds.

19. A photosensitive composition for a lithographic printing plate according to claim 17, wherein the binder resin (A) has an alkali-soluble group.

20. A photosensitive composition for a lithographic printing plate according to claim 18, wherein the binder resin (A) has an alkali-soluble group.

21. A photosensitive lithographic printing plate comprising:

a metal support; and a photosensitive composition for a lithographic printing plate according to claim 17 which is provided on the metal support.

22. A photosensitive lithographic printing plate comprising:

a metal support; and a photosensitive composition for a lithographic printing plate according to claim 18 which is provided on the metal support.

23. A photosensitive lithographic printing plate comprising:

a metal support; and a photosensitive composition for a lithographic printing plate according to claim 19 which is provided on the metal support.

24. A photosensitive lithographic printing plate comprising:

a metal support; and a photosensitive composition for a lithographic printing plate according to claim 20 which is provided on the metal support.

* * * * *